(12) United States Patent
Viala et al.

(10) Patent No.: US 10,014,800 B2
(45) Date of Patent: Jul. 3, 2018

(54) ELECTRICITY GENERATOR

(71) Applicants: Commissariat à l'énergie atomique et aux énergies alternatives, Paris (FR); Institut Polytechnique de Grenoble, Grenoble (FR); Centre National de la Recherche Scientifique, Paris (FR)

(72) Inventors: Bernard Viala, Sassenage (FR); Gor Lebedev, Grenoble (FR); Jérome Delamare, Grenoble (FR); Lauric Garbuio, Pinet d'uriage (FR); Thomas Lafont, Lasalle (FR); Orphée Cugat, Poisat (FR)

(73) Assignees: Commissariat à l'énergie atomique et aux énergies alternatives, Paris (FR); Institut Polytechnique de Grenoble, Grenoble (FR); Centre National de la Recherche Scientifique, Paris (FR)

( * ) Notice: Subject to any disclaimer, the term of this patent is extended or adjusted under 35 U.S.C. 154(b) by 535 days.

(21) Appl. No.: 14/437,813

(22) PCT Filed: Oct. 15, 2013

(86) PCT No.: PCT/EP2013/071479
§ 371 (c)(1),
(2) Date: Apr. 22, 2015

(87) PCT Pub. No.: WO2014/063951
PCT Pub. Date: May 1, 2014

(65) Prior Publication Data
US 2015/0295519 A1    Oct. 15, 2015

(30) Foreign Application Priority Data

Oct. 22, 2012 (FR) ...................... 12 60047

(51) Int. Cl.
*H02N 2/18* (2006.01)
*H01H 59/00* (2006.01)
(Continued)

(52) U.S. Cl.
CPC ............ *H02N 2/181* (2013.01); *H01H 59/00* (2013.01); *H01L 41/00* (2013.01); *H02N 2/18* (2013.01);
(Continued)

(58) Field of Classification Search
CPC ........... H02N 2/181; H02N 2/186; H02N 2/18
(Continued)

(56) References Cited

U.S. PATENT DOCUMENTS 6,522,048 B1 * 2/2003 Burns .................... H02N 2/181
                                                    310/316.01
6,552,048 B2 * 4/2003 Kirsch ................. C07D 211/14
                                                    514/326

(Continued)

FOREIGN PATENT DOCUMENTS

| EP | 1426995 | 6/2004 |
| FR | 2912128 | 8/2008 |
| WO | 2007063194 | 6/2007 |

OTHER PUBLICATIONS

Zakharov et al.: "Thermal energy conversion by coupled shape memory and piezoelectric effects", Journal of Micromechanics & Microengineering, vol. 22, No. 9 (2012).

(Continued)

*Primary Examiner* — Thomas Dougherty
*Assistant Examiner* — Karen B Addison
(74) *Attorney, Agent, or Firm* — Occhiuti & Rohlicek LLP

(57) ABSTRACT

An electricity generator including a first converter suitable for converting a variation of an energy to be harvested into (Continued)

a corresponding excess of electrical charges. The generator includes a circuit for collecting the excess of electrical charges, the circuit has a first controllable mechanical switch, and a control device for the first switch designed to control the switching of the switch to its closed position when the excess of electrical charges exceeds a first predetermined threshold. The switch is a magnetic switch and the control device comprises a variable magnetic field source which controls the switching of the first switch to its closed position only at the time when the excess of electrical charges exceeds the first predetermined threshold.

19 Claims, 6 Drawing Sheets

(51) Int. Cl.
  *H02N 10/00* (2006.01)
  *H01L 41/00* (2013.01)
  *H01L 41/113* (2006.01)

(52) U.S. Cl.
  CPC ............. *H02N 2/186* (2013.01); *H02N 10/00* (2013.01); *H01L 41/1134* (2013.01); *H01L 41/1136* (2013.01); *Y10T 307/826* (2015.04)

(58) Field of Classification Search
  USPC .................... 310/319, 339, 317, 316.01, 328
  See application file for complete search history.

(56) References Cited

U.S. PATENT DOCUMENTS

| | | | |
|---|---|---|---|
| 6,995,496 B1 | 2/2006 | Hagood, IV et al. | |
| 7,397,169 B2 | 7/2008 | Nersessian et al. | |
| 2004/0126620 A1 | 7/2004 | Viehland et al. | |
| 2004/0251789 A1* | 12/2004 | Sakai | H02N 2/181 310/339 |
| 2011/0083714 A1 | 4/2011 | Descure | |
| 2012/0133151 A1* | 5/2012 | Bottarel | H02K 35/02 290/1 A |

OTHER PUBLICATIONS

S. Boisseau, G. Despesse and A. Sylvestre, "Optimization of an electret-based energy harvester", Smart Material and Structures, 19 075015, IOP Publisching Ltd. (2010).

Lafont et al., "Magnetostrictive-piezoelectric composite structures for energy harvesting," Journal of micromechanics and microengineering, No. 22 (2012).

* cited by examiner

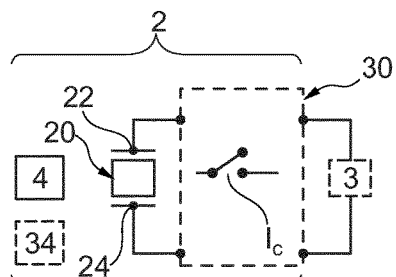
Fig. 1
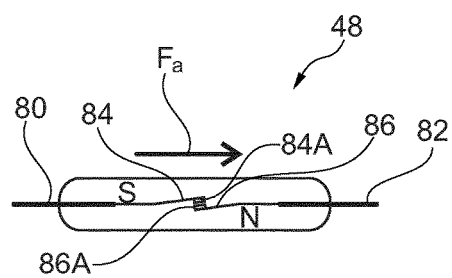
Fig. 4
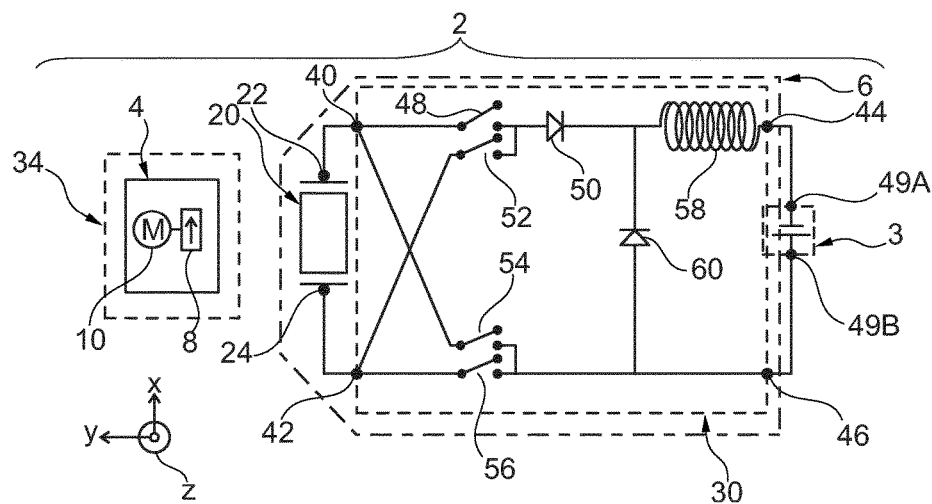
Fig. 2
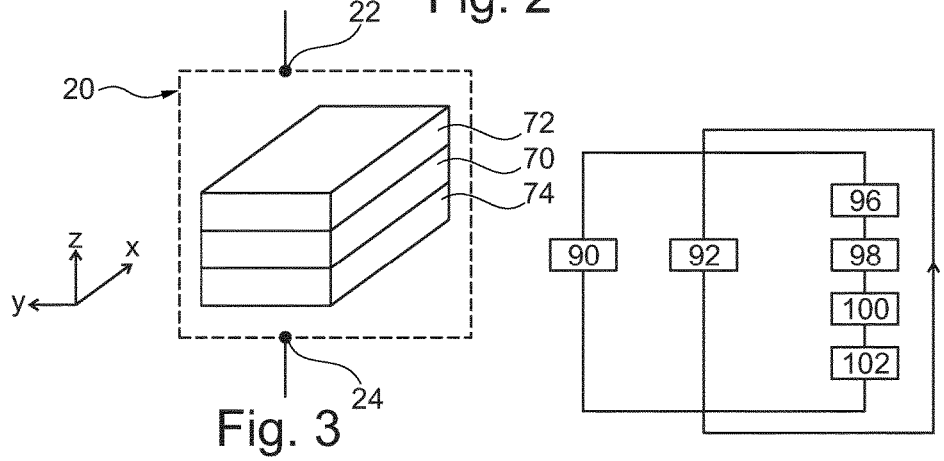
Fig. 3
Fig. 5

ELECTRICITY GENERATOR

RELATED APPLICATIONS

This application is a U.S. National Stage of international application number PCT/EP2013/071479 filed Oct. 15, 2013, which claims the benefit of the priority date of French Patent Application FR 1260047, filed Oct. 22, 2012, the contents of which are herein incorporated by reference.

FIELD OF INVENTION

The invention relates to an electricity generator.

BACKGROUND

Self-powered systems such as, for example, arrays of wireless standalone sensors require an in-situ electricity generator. These systems are often complex and comprise numerous elements which are sometimes installed out of reach. In these situations, maintenance of the system is complicated and costly if, for example, a discharged battery replacement were to become necessary. It is therefore desirable not to replace the battery throughout the lifetime of the system in order to reduce the maintenance costs and to eliminate the associated waste products.

It is in this context that electricity generators equipped with energy harvesters have been proposed. Energy harvesting is based on the use of energy sources freely available in the environment such as light, temperature changes, vibrations or similar, to generate electricity. For this conversion, an energy converter is used.

At the output of the energy converter, it is desirable to harvest the energy at a high useful voltage to be easily formatted by a load powered by this electric generator without too much energy wastage.

Thus, it has been proposed, in the application WO 2007/063194, to use a collection circuit and a control device for this collection circuit which make it possible to transfer the energy generated by the converter to the load to be powered only when this energy has reached a sufficient threshold.

Thus, known electricity generators comprise:
  a first converter equipped with first and second connection terminals, this first converter being suitable for converting a variation of an energy to be harvested into a corresponding excess of electrical charges on the first connection terminal relative to the second terminal,
  a collection circuit for collecting the excess of electrical charges on the first connection terminal, this circuit being equipped:
    with an output terminal via which the collected charges are delivered, and
    with a first controllable mechanical switch connected to the first connection terminal, this first switch being suitable for switching between an open position in which it prevents the discharging of the electrical charges through the first connection terminal and a closed position in which it allows the discharging of the electrical charges through the first connection terminal, the closed position in the mechanical switch being obtained by the bearing of an electrical contact directly on another electrical contact so as to establish an electrical continuity and the open position being obtained by the mechanical separation of these two electrical contacts and the interposition between these two electrical contacts of an electrically insulating medium, and
  a control device for the first switch designed to control the switching of this switch to its closed position when the excess of electrical charges present on the first connection terminal exceeds a first predetermined threshold.

As described in the application WO 2007/063194, the solid-state switches of the collection circuit are typically transistors or thyristors. It is known practice to power these switches from electrical charges produced by the first converter so as to allow a standalone operation of the energy harvester, that is to say by using only the energy to be harvested.

Prior art is also known from U.S. Pat. No. 6,522,048 B1, EP 1 426 995 A1 and from the paper by Dimitry Zakharov et al.: "Thermal energy conversion by coupled shape memory and piezoelectric effects", Journal of Micromechanics & Microengineering, volume 22, No. 9, Aug. 24, 2012, page 99005.

SUMMARY OF INVENTION

The invention aims to improve the efficiency of such an energy generator. The efficiency is defined here as being the ratio between the quantity of energy actually transmitted to the load to be powered over the quantity of energy produced by the first converter.

Its subject is therefore an energy generator according to claim 1.

The applicant has discovered that when the quantity of energy that can be harvested is small and the time taken to harvest it is long, the lowering of the efficiency was partly due to the use of solid-state switches in the collection circuit. In effect, the transistors and thyristors or similar consume electricity when they switch between their closed and open positions. The electricity consumed by the switches of the collection circuit is not therefore transmitted to the load to be powered by the electricity generator. Furthermore, even in the open position, there is always a leakage current in the transistors and thyristors. This leakage current enables the first converter to discharge outside of the planned switching instants. This problem of discharging of the first converter by leakage currents is all the greater when the variations of the energy to be harvested are slow and therefore the switching frequency of the switches is low. Thus, the presence of transistors or thyristors in the known energy harvesters reduces their efficiency.

In the above generator, the controllable switch is a mechanical switch and not a solid-state switch such as a transistor or a thyristor as in the known collection circuits. Consequently, the switching of this switch between the open and closed positions does not consume the electrical energy produced by the first converter. Furthermore, with the mechanical switch there is no leakage current. The collection circuit can therefore be used to harvest charges at a high useful voltage even if the variations of the energy to be harvested are very slow.

Finally, the fact that the mechanical switch used is a magnetic switch makes it possible to limit the quantity of electrical energy consumed by this switch and its control circuit which increases the autonomy of the generator.

The embodiments of this generator can comprise one or more of the features of the dependent claims.

These embodiments of the generator further offer the following advantages:
  using the variable magnetic field directly generated by the source of energy to be harvested to control the first switch makes it possible to produce a standalone control device which does not consume the electrical charges produced by the first converter and therefore to further increase the efficiency of the electrical generator;

arranging the magnetic switches differently in the magnetic field of a variable magnetic field source makes it possible to control the closure of the switches at different moments synchronized on the quantity of electrical charges produced without consuming the electrical charges produced;

using a first converter comprising a first electromechanical transducer and a second magnetic transducer makes it possible to generate electricity even from very slow variation of the magnetic field and to limit the bulk of the first converter;

using a second converter to convert a variation of the energy to be harvested into a variable magnetic field makes it possible to produce electricity from a source of energy to be harvested other than a variable magnetic field;

arranging the magnetic switches differently in a variable magnetic field makes it possible to control the closure of these switches at different moments synchronized on the excess of electrical charges produced without consuming the electrical charges produced;

using a first converter comprising a first electromechanical transducer and a second transducer suitable for exerting a stress on this first transducer makes it possible to generate electricity even from very slow variation of the energy to be harvested and to limit the bulk of the first converter;

using a thermomechanical transducer as second transducer of the first converter makes it possible to harvest electrical energy from a temperature variation and to avoid having recourse to radiators to impose a temperature gradient;

using a material with shape memory makes it possible to exert greater stresses on the electromechanical transducer;

using the same thermomechanical transducer for the first converter and for the control device makes it possible to limit the bulk of the energy harvester;

the use of a first and of a second magnetic switches connected between the output terminal and, respectively, the first and second connection terminals makes it possible to rectify the difference in potentials between the first and second connection terminals of the first converter by limiting the number of diodes used and therefore by limiting the consumption of the collection circuit;

the use of first and second magnetic switches to transfer the excess of charge from the converter from one connection terminal to the other alternately makes it possible to amplify the excess of charges on the connection terminal of the converter and therefore to transfer, in a single operation, a greater quantity of electrical charges to the load to be powered;

using a coil that is passed through by the current generated by the first converter and a magnetic switch placed in the magnetic field of this coil makes it possible to control the closure of this magnetic switch in response to the electrical current generated crossing a third predetermined threshold by consuming very little of the charges produced by the first converter;

using a piezoelectric material as first transducer of the first converter makes it possible to simply transform a stress variation into electricity.

The invention will be better understood on reading the following description, given merely by way of non-limiting example and with reference to the drawings.

BRIEF DESCRIPTION OF THE DRAWINGS

FIG. 1 is a general diagram of an electricity generator;

FIG. 2 is a schematic illustration of a first embodiment of the electricity generator of FIG. 1;

FIG. 3 is a schematic illustration of an energy converter used in the electricity generator of FIG. 2;

FIG. 4 is a schematic illustration of a magnetic switch used in the generator of FIG. 2;

FIG. 5 is a flow diagram of a method for generating electricity using the generator of FIG. 2;

DETAILED DESCRIPTION

Figure 6:
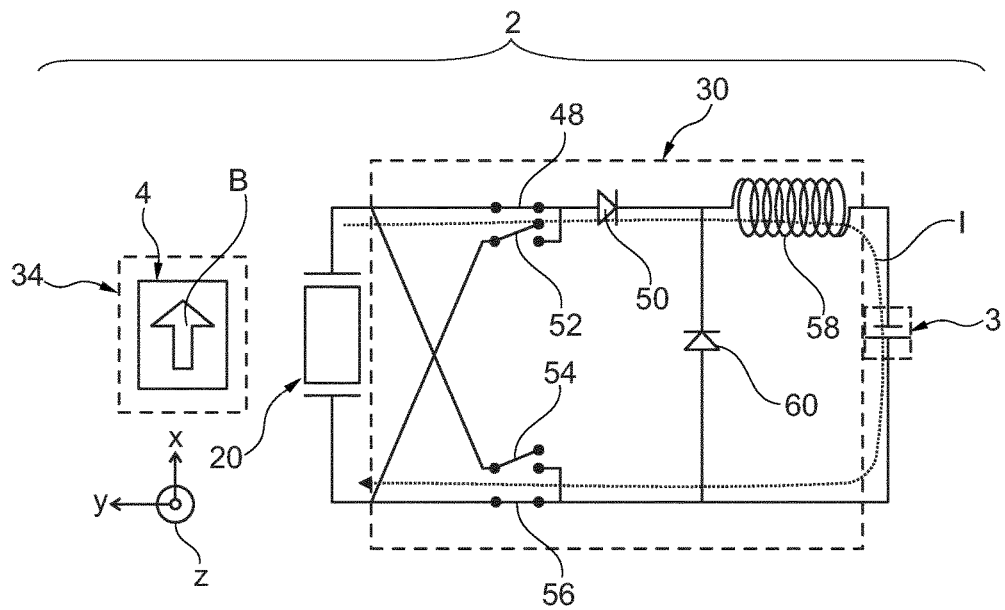
FIGS. 6 and 7 are schematic illustrations of two different operating positions of the electricity generator of FIG. 2.

In the figures, the same references are used to denote the same elements.

Hereinafter in this description, the features and functions that are well known to those skilled in the art are not described in detail.

FIG. 1 represents an electricity generator 2 for powering an electrical load. In this particular case, the electrical load is a load capable of storing electrical energy. For example, it is a capacitor 3.

The generator 2 comprises a source 4 of energy to be harvested and a harvester 6 of this energy. The harvester 6 powers the capacitor 3 from the energy harvested.

The source 4 is a source of energy freely available in the environment of the harvester 6.

The harvester 6 comprises a converter 20, a collection circuit 30 and a control device 34 for the circuit 30.

The converter 20 converts a variation of the energy to be harvested into a corresponding excess of electrical charges on one connection terminal 22 or 24 relative to the other connection terminal 22 or 24.

The circuit 30 collects the excess of electrical charges on the terminal 22 or 24 and transfers the collected electrical charges to the capacitor 3. For this, it is equipped with one or more controllable mechanical switches Ic.

The device 34 controls the switches Ic in such a way as to transfer the excess of electrical charges generated by the converter 20 to the capacitor 3 only when this excess has reached a sufficient threshold.

The figures below describe in more detail different possible embodiments of the energy harvester suited to different types of energy to be harvested.

FIG. 2 represents in more detail a first embodiment of the generator 2 in the case where the source 4 is a variable magnetic field source. The amplitude of the components $B_X$ and $B_Y$ of the variable magnetic field, respectively, parallel to directions X and Y, varies over time. Here, the directions X and Y are mutually orthogonal and horizontal. In this particular embodiment, the variations of the components $B_X$ and $B_Y$ are temporally phase-shifted relative to one another by a predetermined value. In this example, this phase shift is equal to 90° and the components $B_X$ and $B_Y$ are said to be in phase opposition.

For example, the source 4 comprises a permanent magnet 8, the magnetic moment of which is horizontal, and a motor 10 rotationally driving the magnet 8 about a vertical axis parallel to a direction Z. The direction Z is at right angles to the directions X and Y.

Here, the converter 20 generates an excess of electrical charges on the terminal 22 that is proportional to the absolute value of the amplitude of the component $B_X$. It also generates an excess of electrical charges on the terminal 24 that is proportional to the absolute value of the amplitude of the component $B_Y$. Since the amplitudes of the components $B_X$ and $B_Y$ are in phase opposition, when the excess of electrical charges is maximum on the terminal 22, it is minimum on the terminal 24 and vice versa.

Preferably, the converter 20 is arranged in proximity to the source 4. For example, the shortest distance between the converter 20 and the source 4 is less than 10 cm and, preferably, less than 1 cm.

The converter 20 is also suitable for storing the electrical charges produced on the terminals 22 and 24 when these terminals are electrically insulated from any other external electrical circuit likely to enable it to be discharged. Thus, the converter 20 also operates as a capacitor. For example, in the absence of a connection to an external electrical circuit, the excess of charges present on the terminal 22 or 24 varies by less than 50% in more than 1 ms and, preferably, in more than 1 s or 1 min or 1 h.

The converter 20 is described in more detail with reference to FIG. 3.

The circuit 30 comprises two input terminals 40 and 42 directly connected, respectively, to the terminals 22 and 24. The circuit 30 also comprises two output terminals 44 and 46 directly connected, respectively, to terminals 49A and 49B of the capacitor 3.

Here, it is said that the elements A and B are "directly connected" when there is an electrical link connecting these elements A and B which does not pass through another electrical component such as another switch, another diode or an inductance. Furthermore, in this description, unless specifically stated otherwise, the term "connect" means "connect electrically".

The circuit 30 is designed to transfer the electrical charges accumulated on the terminals 22 and 24 to the output terminal 44. To this end, it comprises:
- a mechanical switch 48 directly connected on one side to the terminal 40 and on the other side to the anode of a diode 50,
- a mechanical switch 52 directly connected on one side to the terminal 42 and on the other side to the anode of the diode 50,
- a mechanical switch 54 directly connected on one side to the terminal 40 and on the other side directly to the terminal 46, and
- a mechanical switch 56 directly connected on one side to the terminal 42 and on the other side to the terminal 46.

The cathode of the diode 50 is electrically connected to the terminal 44 via an inductance 58.

The circuit 30 also comprises a diode 60, the cathode of which is directly connected between the cathode of the diode 50 and the inductance 58, and the anode of which is directly connected to the terminal 46. The switches 48, 52, 54 and 56 are suitable for switching between a closed position in which they conduct electricity and an open position in which they do not conduct electricity. The switching of these switches between their closed and open positions is controlled by the control device 34. An embodiment of these switches is described in more detail with reference to FIG. 4.

Figure 7:
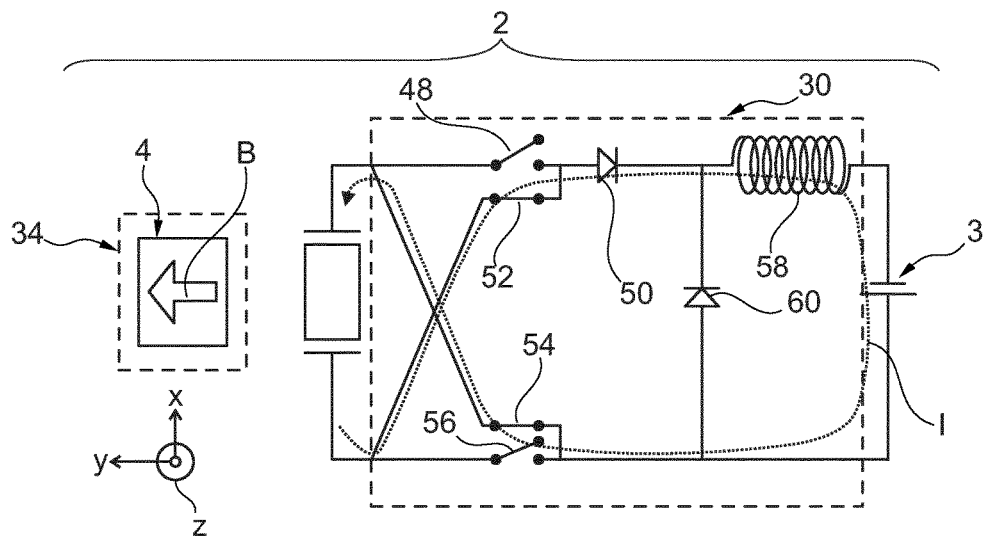

The device 34 controls the switching of the switches of the circuit 30 to switch, alternately, between:
- a first position of discharging, represented in FIG. 6, in which the excess of electrical charges accumulated on the terminal 22 is transferred to the terminal 44,
- a second position of discharging, represented in FIG. 7, in which the excess of electrical charges accumulated on the terminal 24 is transferred to the terminal 44, and
- a rest position, represented in FIG. 2, in which the terminals 22 and 24 are electrically insulated from any other electrical circuit so as to allow electrical charges to accumulate between these terminals.

More specifically, the device 34 is designed to:
- control the switchover to the first position of discharging only when the excess of charges accumulated on the terminal 22 exceeds a first predetermined threshold $S_1$,
- control the switchover to the second position of discharging only when the excess of charges accumulated on the terminal 24 exceeds a second predetermined threshold $S_2$, and
- control the switchover to the rest position as long as the excess of electrical charges accumulated on the terminal 22 is below the threshold $S_1$ and on the terminal 24 is below the threshold $S_2$.

To this end, the device 34 here consists only of the source 4 of energy to be harvested. In other words, in this particular embodiment, the source 4 of energy to be harvested and the control device 34 are simply one and the same element.

FIG. 3 represents the converter 20 in more detail. This converter 20 is capable of converting very slow variations of the energy to be harvested into electricity. "Slow variation" describes variations with a fundamental frequency below 1 Hz or 100 Hz. To this end, the converter 20 converts a variation of the amplitude of the variable magnetic field in a given direction into a generation of an excess of charges on the terminal 22 and, alternately, on the terminal 24. This conversion is done almost instantaneously such that the voltage between the terminals 22 and 24 varies at the same time and as the amplitude of the variable magnetic field varies in a given direction.

In this embodiment, the converter 20 comprises a magnetic transducer associated with an electromechanical transducer. The magnetic transducer is a layer 70 made of magnetostrictive material. The electromechanical transducer here comprises a top layer 72 and a bottom layer 74 made of piezoelectric material. The layers 72, 74 are directly fixed with no degree of freedom, respectively, above and below the layer 70. Here, the layers 70, 72 and 74 extend along a longitudinal direction parallel to the direction X.

The layer 70 is produced in a magnetostrictive material, the absolute value of the magnetorestriction coefficient $\lambda_s$ of which is greater than 10 ppm (parts per million) and preferably greater than 100 or 1000 ppm. The coefficient $\lambda_s$ is defined by the following relationship: $\lambda_s = \Delta L/L$, in which:

ΔL is the rate of elongation of the magnetostrictive material in a given direction, and L is the length of this material in this direction in the absence of external magnetic field.

Here, the coefficient $\lambda_s$ is positive. For example, the magnetostrictive material is Terfenol-D or FeSiB.

The piezoelectric layers are glued directly on either side of the layer 70. For example, the coefficient of coupling k of these piezoelectric layers is greater than 5% or 10%. This coefficient of coupling is defined in the standard ANSI/IEEE 176-1987 "ANSI/IEEE standard on piezoelectricity" or in the standards of the family EN50324. For example, the piezoelectric material used is PZT ($PbZt_xTi_{1-x}O_3$) or similar.

For more details on the converter 20, the reader can refer to the following article A1:

T. Lafont, J. Delamare, G. A. Lebedev, D. I. Zakharov, B. Viala, O. Cugat, L. Gimeno, N. Galopin, L. Garbuio and O. Geoffroy, "*Magnetostrictive-piezoelectric composite structures for energy harvesting*", Journal of micromechanics and microengineering, No. 22, 2012.

The layer 70 makes it possible to generate a stress of several tens of MPa on the piezoelectric layers 72 and 74 which generate, in response, a voltage of several tens of volts between the terminals 22 and 24. Typically, the maximum voltage generated between the terminals 22 and 24 exceeds 200 Vdc. It has been measured that the energy produced by such a converter can be greater than 50 µJ and, preferably, greater than 100 µJ in response to a quarter-turn rotation of the magnet 8.

FIG. 4 represents a possible embodiment of the switch 48 in more detail. Here, the switch 48 is a magnetic switch. More specifically, in the particular case represented, the switch 48 is a switch known as a "Reed" switch. It comprises two electrical bump contacts 80 and 82 each electrically connected to a respective moving blade 84 and 86. The blades 84, 86 are each terminated by an electrical contact, respectively, 84A and 86A. The blades 84, 86 are suitable for displacing the contacts 84A and 86B between:

an open position in which they are mechanically separated from one another by an insulating medium to electrically insulate the bump contacts 80 and 82, and a closed position in which they are directly mechanically bearing on one another to electrically connect the bump contacts 80 and 82.

The insulating medium is, for example, an electrically insulating gas or liquid or a gas at very low pressure, that is to say a pressure less than $10^5$ Pa or 100 Pa or 0.1 Pa.

The bump contacts 80, 82 are connected to the rest of the circuit 30.

The blades 84 and 86 are produced in a magnetic material. For example, the magnetic material exhibits a relative permeability greater than 100 or 1000 for a zero frequency of the magnetic field. They extend essentially parallel to a common direction of actuation represented by an arrow $F_a$ in FIG. 4.

When the magnetic field, in the switch 48, reaches an actuation configuration, the force exerted by this magnetic field makes it possible to displace the contacts 84A and 86A from the open position to the closed position. Conversely, outside of an actuation configuration, the magnetic field in the switch is insufficient to keep the contacts 84A, 86A in the closed position.

A person skilled in the art knows that the magnetic field mappings around a magnet are not limited to a single direction and that the sensitivity of a magnetic switch is complex, notably in terms of amplitude, of direction and of reversibility (or of hysteresis). However, he or she knows to adapt the position of the magnet and of the switch accordingly. Thus, hereinafter in this description, for simplicity, it is considered that an actuation configuration is reached when the amplitude of the magnetic field, in the switch 48, exceeds a switching threshold $S_c$ in the direction $F_a$. Conversely, it is considered, still for simplicity, that if the amplitude of the magnetic field parallel to the direction $F_a$ is below this threshold $S_c$, then the contacts 84A and 86A are displaced, by elastic deformation of the blades 84, 86, from their closed position to the open position and then remain in the open position. The switch 48 is therefore a normally open switch. The value of the threshold $S_c$ beyond which the switch 48 switches from its open position to its closed position determines the sensitivity of the switch 48 to the magnetic field.

The switch 48 is fixed with no degree of freedom relative to the source 4. In the case of the switch 48, its direction of actuation is parallel to the direction X. Furthermore, its sensitivity is chosen such that the contacts 84A and 86A are displaced from the open position to the closed position only at the moment when the amplitude of the component $B_X$ reaches an amplitude corresponding to an excess of charges on the terminal 22 above the threshold $S_1$. Thus, the switching of the switch 48 is directly controlled by the source 4. More specifically, in the case of the source 4 and of the converter 20, the excess of electrical charges on the terminal 22 is maximum when the magnetic moment of the magnet 8 is parallel to the direction X. Thus, the sensitivity of the switch 48 is chosen such that the latter switches to the closed position only when the magnetic moment of the magnet 8 is aligned on the direction X to within plus or minus 30° and, preferably, to within plus or minus 5°. The switch 56 is identical to the switch 48. The switches 52 and 54 are identical to the switch 48 except that their directions of actuation are parallel to the direction Y and not parallel to the direction X.

It will be noted that, here, the angular offset between the directions of actuation of the switches 48 and 56 and of the switches 52 and 54 is equal to the value of the angular phase shift between the variation of the excess of electrical charges on the terminals 22 and 24.

The operation of the generator 2 will now be described through the method of FIG. 5 and with reference to FIGS. 6 and 7.

In a step 90, permanently, the source 4 generates the variable magnetic field. Here, only the direction of the magnetic field varies over time such that the amplitudes of the components $B_X$ and $B_Y$ are phase-shifted by an angle of 90°.

In parallel, in a step 92, the converter 20 permanently converts the variation of the variable magnetic field into a corresponding variation of the quantity of charges on its terminals 22 and 24.

In parallel with these steps 90 and 92, the control of the collection circuit 30 proceeds. For this, more specifically, the circuit 30 is controlled to collect the excess of electrical charges accumulated, alternately, on the terminals 22 and 24 only at the moment when the excess is maximum.

Initially, the magnetic moment of the magnet 8 is in an intermediate direction between the directions X and Y, that is to say neither parallel to the direction X nor parallel to the direction Y and revolves towards the direction X. The amplitudes of the components $B_X$ and $B_Y$ are then below the switching threshold $S_c$ of the switches. In this state, in a step 96, the source 4 controls the switching of the switches 48, 52, 54 and 56 to the open position then keeps these switches in the open position. The collection circuit is therefore in its rest position represented in FIG. 2. In this rest position, the terminals 22 and 24 are electrically insulated from the terminals 44 and 46. The charges produced by the converter 20 are therefore accumulated on the terminal 22.

Then, the direction of the magnet 8 becomes parallel to the direction X. The excess of charges accumulated on the terminal 22 is maximum. In effect, when the moment of the magnet 8 is parallel to the direction X, this corresponds to a maximum deformation of the layer 70 in the direction X. At this moment, the amplitude of the component $B_X$ exceeds the switching threshold $S_c$ of the switches 48 and 56. In a step 98, the source 4 then controls the switching of these switches 48, 56 to their closed position. The circuit 30 switches over to its first position of discharging represented in FIG. 6. The electrical charges present on the terminal 22 are transferred to the capacitor 3 which stores them. In FIGS. 6 and 7, the direction of circulation of the current corresponding to this transfer of electrical charges is represented by an arrow I. In these same figures, the direction of the magnetic moment of the magnet 8 is represented by an arrow B.

Then, the magnet 8 continues to revolve, this time towards the direction Y. The direction of the magnetic moment of the magnet 8 therefore switches back into an intermediate position. The amplitude of the components $B_X$ and $B_Y$ becomes below the threshold $S_c$ of the switches 48, 52, 54 and 56. In a step 100, the source 4 then controls the switching of the switches to the open position. The circuit 30 returns to its rest position represented in FIG. 2.

Finally, when the magnetic moment of the magnet 8 becomes parallel to the direction Y, this corresponds to a maximum deformation of the layer 70 in the direction Y and therefore to a maximum excess of charges on the terminal 24.

At the same time, the amplitude of the component $B_Y$ exceeds the threshold $S_c$ of only the switches 52 and 54. Thus, in a step 102, the source 4 controls the closure of these switches. The circuit 30 switches over to its second position of discharging represented in FIG. 7. In this position, the electrical charges accumulated on the terminal 24 are transferred to the terminal 49A of the capacitor 3 which stores them.

The direction of the magnetic moment of the magnet 8 continues to revolve to once again approach the direction X. There is then a return to the step 96.

Figure 8:
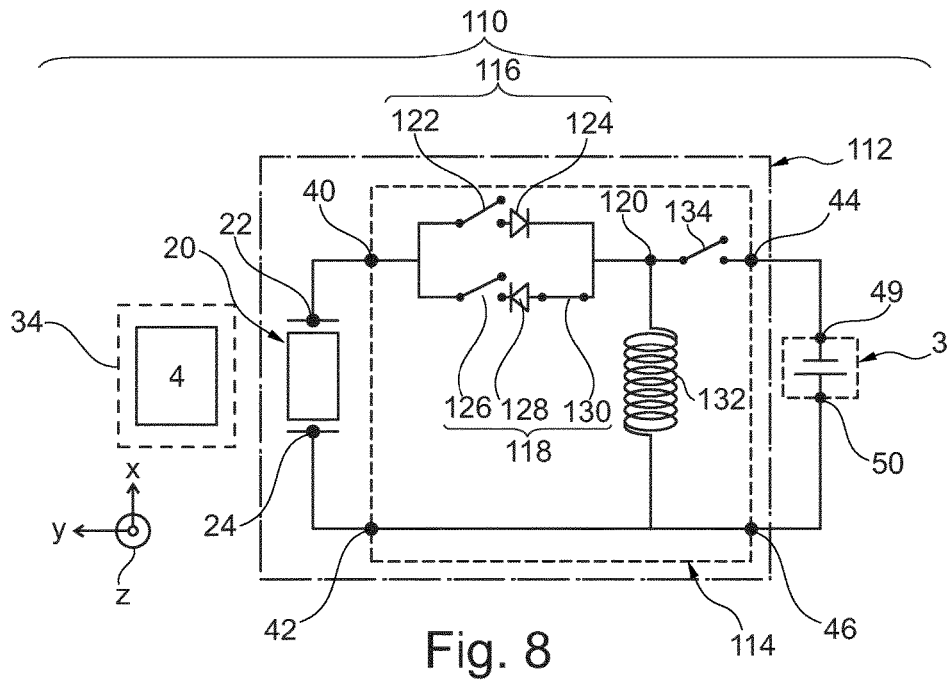
FIG. 8 is a schematic illustration of a second embodiment of the electricity generator of FIG. 1.

FIG. 8 represents a generator 110 identical to the generator 2 except that the energy harvester 6 is replaced by an energy harvester 112. The harvester 112 is identical to the harvester 6 except that the collection circuit 30 is replaced by a collection circuit 114.

The collection circuit 114 comprises the same input terminals 40, 42 and the same output terminals 44, 46. It also comprises two branches 116 and 118 connected in parallel between the terminals 40 and a connection point 120. The branch 116 comprises a switch 122 connected directly in series with a diode 124. The switch 122 is, for example, identical to the switch 48. The anode of the diode 124 is directly connected to the switch 122.

The branch 118 comprises a switch 126 connected in series with a diode 128 and a magnetic switch 130. The switch 126 is, for example, identical to the switch 52. The cathode of the diode 128 is directly connected to the switch 126. The anode of this diode 128 is directly connected to the switch 130. The switch 130 is a normally closed magnetic switch; that is to say that this switch 130 is in the open position as long as the amplitude of the magnetic field along its direction of actuation is below its switching threshold $S_c$.

The point 120 is electrically connected via a coil 132 to the terminals 42 and 46. This point 120 is also connected, via a switch 134 for releasing the charges accumulated, to the terminal 44.

The coil 132 generates a magnetic field proportional to the intensity of the current which passes through it and to the number of its turns. The switch 134 is a normally open magnetic switch which systematically switches into the closed position when the switch 130 switches to the open position and vice versa. For example, to this end, the switches 130 and 134 have a common magnetic blade.

Here, the switches 130 and 134 are placed in the magnetic field generated by the coil 132 in such a way that the switching of these switches 130 and 134 is only controlled by the magnetic field generated by this coil. An example of positioning of these switches relative to the coil is described in more detail with reference to FIG. 9.

Here, the direction of actuation, the number of turns of the coil 132, the sensitivity of the switches 130 and 134 is determined, for example by trial and error, for these switches 130 and 134 to switch only when the intensity of the current passing through the coil 132 exceeds a predetermined threshold $S_b$. This threshold $S_b$ is chosen to correspond to a threshold $S_3$ of the excess of electrical charges present on the terminal 22 several times greater than the threshold $S_1$. In effect, the intensity of the current in the coil 132 is directly proportional to the excess of electrical charges accumulated between the terminals 22 and 24.

Figure 9:
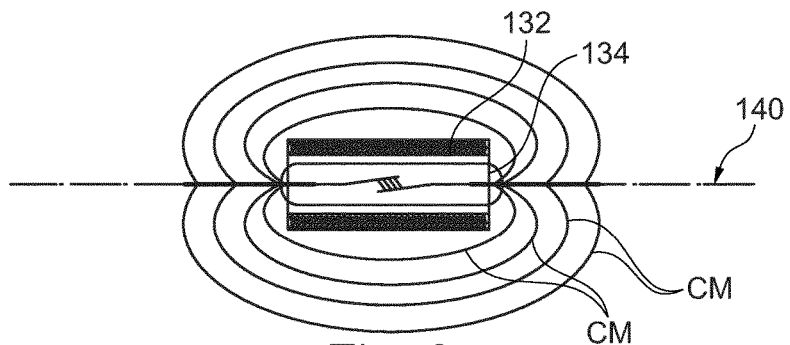
FIG. 9 is a schematic illustration of a magnetic switch used in the electricity generator of FIG. 8.

FIG. 9 represents in more detail the coil 132 and the positioning of the switch 134 relative to this coil. Here, the coil 132 is wound around a winding axis 140. The switch 134 is placed inside the turns of the coil 132 in such a way that its direction of actuation is merged with this winding axis. To simplify FIG. 9, the position of the switch 130 has not been represented. The switch 130 is arranged identically to what was described for the switch 134. In FIG. 9, the lines of the magnetic field outside the coil 132 are represented by lines CM.

Figure 10:
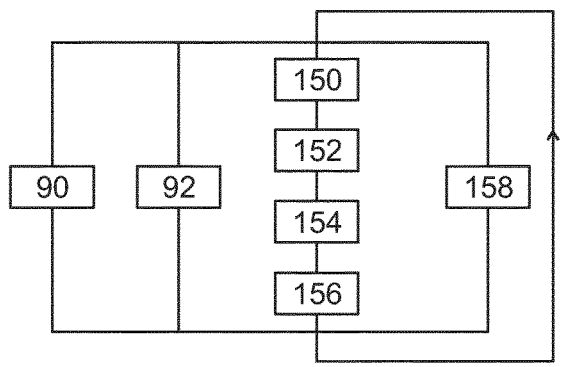
FIG. 10 is a flow diagram of a method for generating electricity using the electricity generator of FIG. 8.
Figure 11:
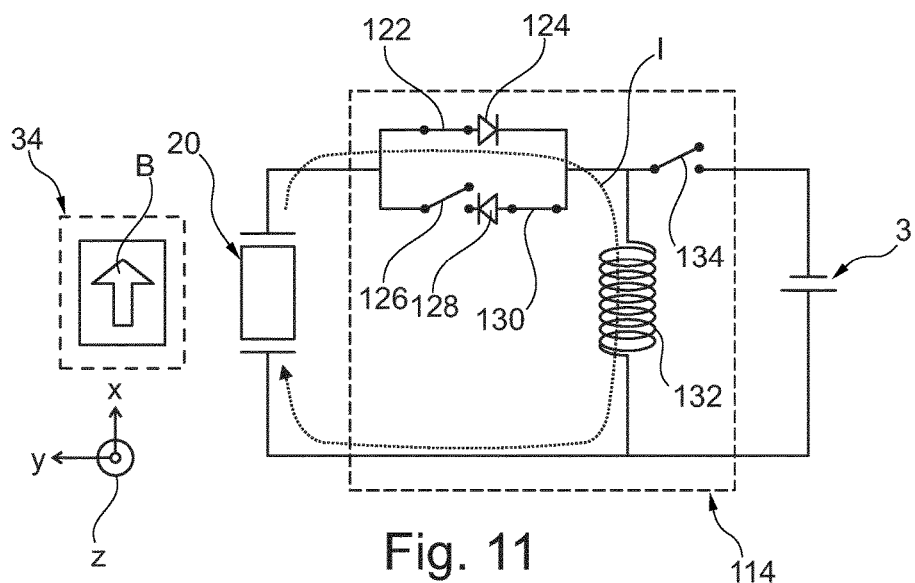
FIGS. 11 to 13 schematically illustrate three different operating positions of the electricity generator of FIG. 8.
Figure 12:
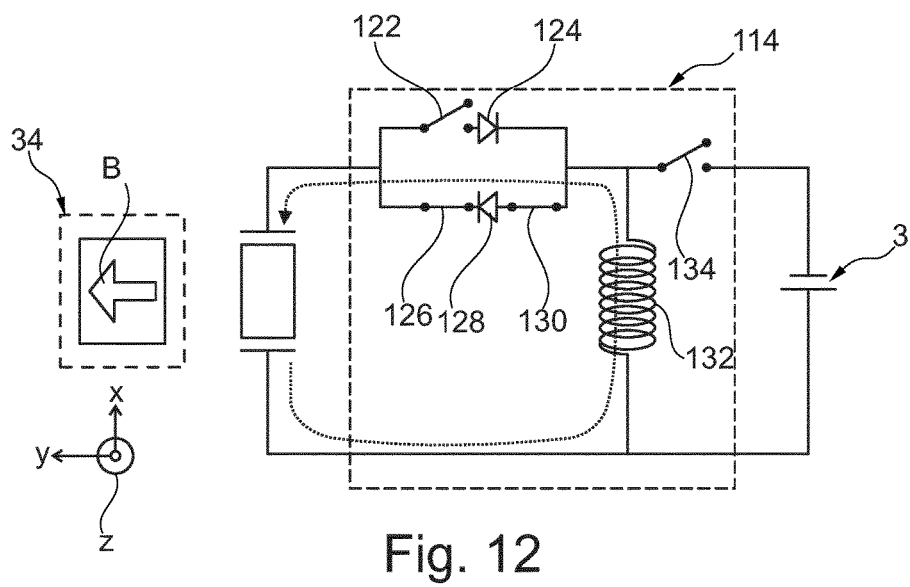
Figure 13:
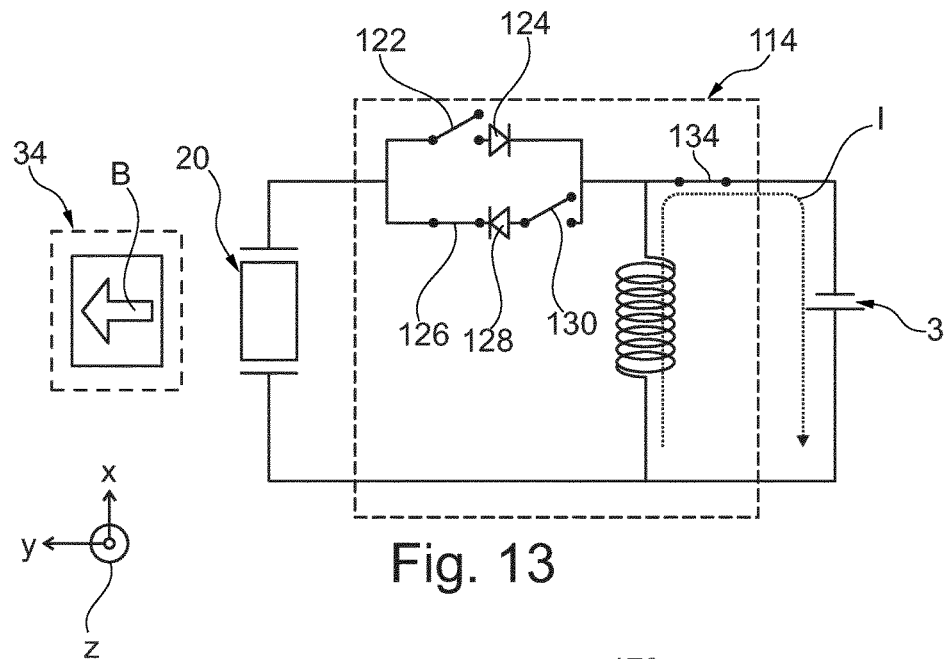

The operation of the generator 110 will now be described with reference to the method of FIG. 10 and via FIGS. 11 to 13. The method of FIG. 10 comprises the same steps 90 and 92 as the method of FIG. 5.

The control of the collection circuit proceeds as follows.

Initially, it is assumed that the converter 20 is completely discharged and that the direction B of the magnetic field generated by the source 4 is in an intermediate position between the directions X and Y and is rotating towards the direction X. In these conditions, the amplitude of the components $B_X$ and $B_Y$ is below the threshold $S_c$ of the switches 122 and 126. In a step 150, the source 4 then controls the switching of these switches to their open position. The circuit 114 is then in its rest position represented in FIG. 8. In a manner similar to what was previously described via the method of FIG. 4, in this rest position, the converter 20 accumulates an excess of electrical charges that it produces on the terminal 22.

Then, the direction B of the magnetic field becomes parallel to the direction X. In response, in a step 152, the source 4 controls the closure of the switch 122. The circuit 114 then switches into its first position of discharging represented in FIG. 11. The charges stored on the terminal 22 are transferred via the coil 132 to the terminal 24. This creates a current which passes through the coil 132. The direction of the current which circulates in the circuit 114 is represented by an arrow I in FIGS. 11 to 13. The direction of the magnetic moment of the magnet 8 is represented by an arrow B in these same figures.

Then, the direction of the magnetic moment of the magnet 8 continues to revolve and once again moves away from the direction X to approach the direction Y. The amplitude of the components $B_X$ and $B_Y$ becomes below the switching threshold $S_c$ of the switches 122 and 126. The source 4 therefore controls, in a step 154, the switching of the switch 122 to the open position and then keeps the switches 122 and 126 in the open position. There is therefore a return to the rest position of the circuit 114 represented in FIG. 8. The excess of charges accumulated on the terminal 24 increases as the direction B approaches the direction Y. However, in this embodiment, the new excess of charges produced is accumulated with the excess transferred in the step 152.

Then, the direction B becomes parallel to the direction Y. The amplitude of the component $B_Y$ is above the threshold $S_c$ of the switch 126. The source 4 then controls, in a step 156, the switching of this switch 126 to the open position. The circuit 114 switches over to its second position of discharging represented in FIG. 12. The stored charges accumulated on the terminal 24 are then transferred to the terminal 22 via the coil 132.

Then, the direction B once again moves away from the direction Y to approach the direction X. There is then a return to the step 150.

The steps 150 and 156 are reiterated a number of times to increase the excess of charges stored, alternately, on the terminals 22 and 24 and therefore increase the intensity of the current which passes through the coil 132 in the steps 152 and 156.

In parallel, in a step 158, when the intensity of the current which passes through the coil 132 reaches the threshold $S_b$, the coil 132 controls the switching of the switches 130 and 134 to, respectively, their open and closed positions. The circuit 114 then switches over to a position of releasing of the accumulated excess of electrical charges to the capacitor 3 represented in FIG. 13. The charges stored by the converter 20 are then transferred to the capacitor 3.

Figure 14:
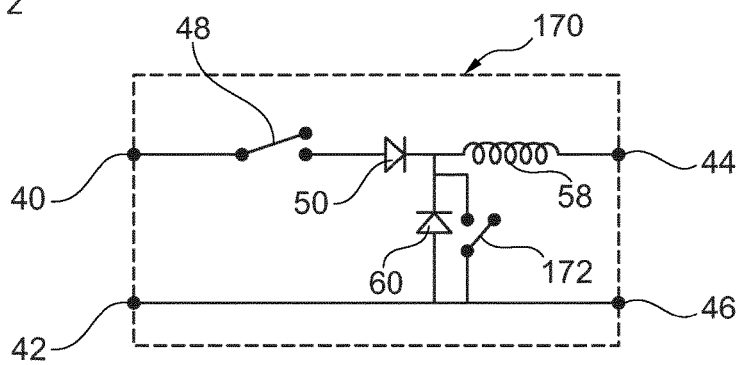
FIGS. 14 and 15 are respective schematic illustrations of two other embodiments of a collection circuit likely to be used in the electricity generator of FIG. 2 or 8.

FIG. 14 represents a collection circuit 170 identical to the circuit 30 except that the switches 52, 54 and 56 are omitted. This circuit 170 is simpler to produce but makes it possible only to transfer the excess of electrical charges produced by the maximum longitudinal deformation of the converter 20 and no longer during its transverse deformation. Furthermore, preferably, a controllable switch 172 is connected in parallel to the diode 60 to avoid the voltage drop caused by this diode. To this end, the switch 172 is controlled in such a way as to:

close at the same time as the diode 60 becomes passing, and alternately open when the diode 60 is non-passing.

For example, the switch 172 is a normally open magnetic switch, the closure of which is controlled by a control coil. The control coil and the switch 172 can be arranged as described with reference to FIG. 9. Here, the control coil is the coil 58.

Figure 15:
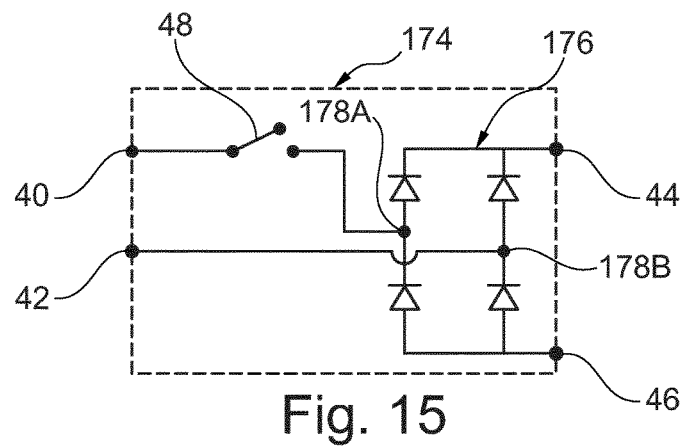

FIG. 15 represents a collection circuit 174 identical to the circuit 30 except that the switches 52, 54 and 56 and the diode 60 are replaced by a diode bridge 176 capable of rectifying the current generated by the discharging of the converter 20.

The diode bridge 176 comprises first and second branches electrically connected in parallel between the terminals 44 and 46. The first branch comprises two diodes connected in series via a midpoint 178A. The second branch also comprises two diodes connected in series via a midpoint 178B. The midpoint 178A is permanently directly connected to one of the electrical contacts of the switch 48. The midpoint 178B is permanently connected to the terminal 42 of the collection circuit, for example, via an inductance which is not represented in FIG. 15.

Figure 16:
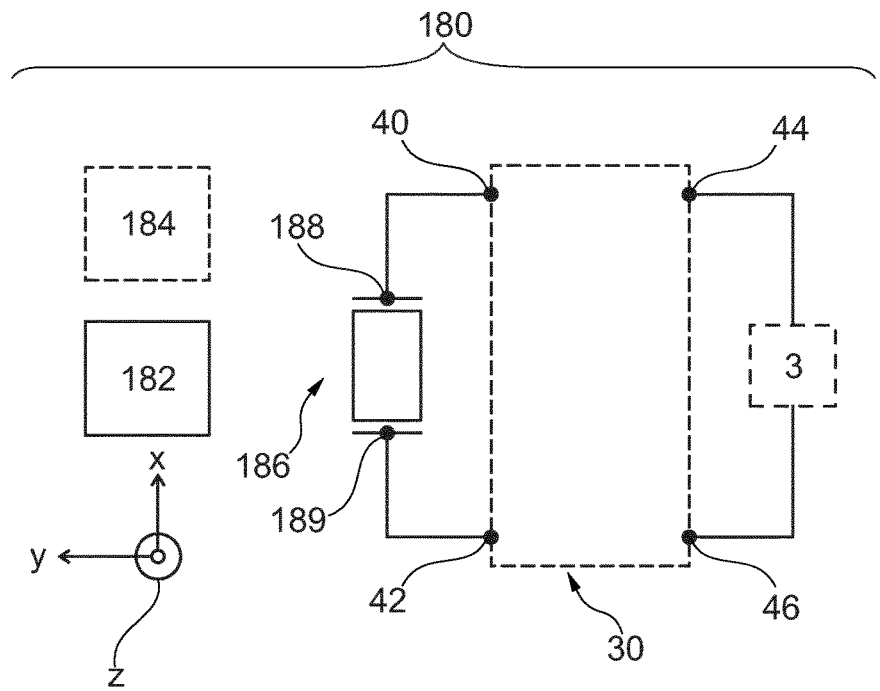
FIG. 16 is a schematic illustration of a third embodiment of the electricity generator of FIG. 1.

FIG. 16 represents an electricity generator 180 identical to the generator 2 except that:

the source 4 is replaced by a source 182 of energy to be harvested, the control device 34 is replaced by a control device 184, and the converter 20 is replaced by a converter 186.

Here, the source 182 of energy to be harvested is a source generating temperature variations of the ambient medium in which the converter 186 is dipped. For example, it can be a hot object that is brought closer to and, alternately, moved away from the converter 186 or the temperature variation of an object. Thus, in this embodiment, the source 182 does not directly generate the variable magnetic field necessary to control the switches of the circuit 30. In this embodiment, the source 182 and the control device 184 of the circuit 170 are therefore two distinct elements.

The converter 186 converts the temperature variation into a corresponding excess of electrical charges on a terminal 188 and, alternately, on a terminal 189. These terminals 188 and 189 are directly connected to the terminals, respectively, 40 and 42 of the collection circuit 30.

Figure 17:
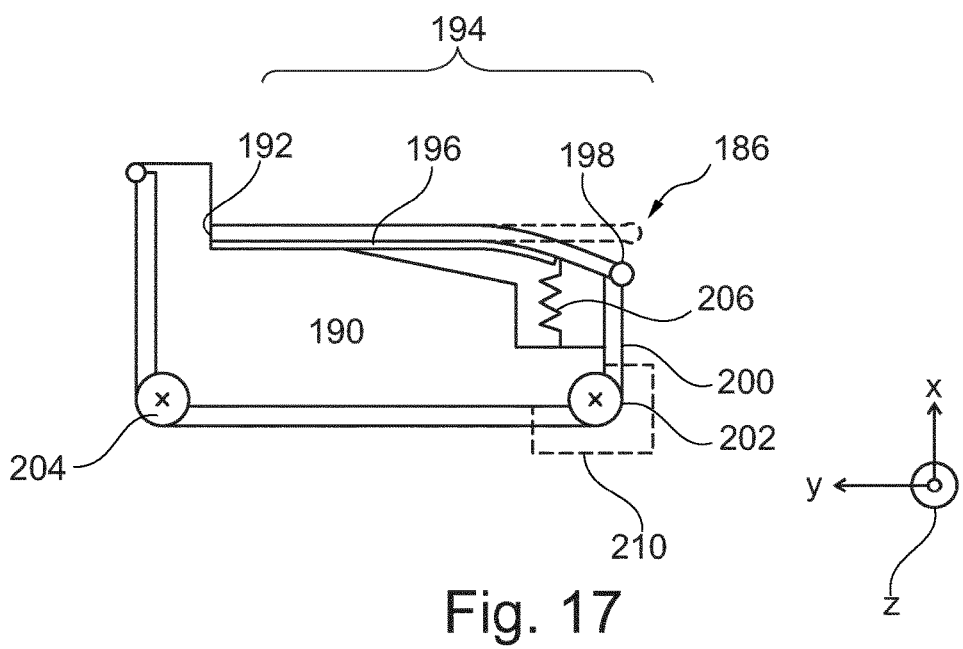
FIG. 17 is a schematic illustration of an energy converter used in the electricity generator of FIG. 16.

FIG. 17 represents a more detailed embodiment of the device 184 and of the converter 186.

The converter 186 comprises a frame 190. A proximal end 192 of a beam 194 is anchored with no degree of freedom in this frame 190. This beam 194 comprises a plate 196 made of piezoelectric material. A distal end 198 of the beam 194 is linked with no degree of freedom to an end of a wire 200. The beam 194 can be displaced between an active position, in which it is curved, and a rest position in which it extends horizontally in the plane Y, Z. The active position is represented by a solid line in FIG. 17 whereas the rest position is represented by a dotted line.

An opposite end of the wire 200 is anchored with no degree of freedom to the frame 190. Between these two ends, the wire 200 is received in grooves of two pullies 202 and 204, the axes of rotation of which are at right angles to the directions X and Y and secured to the frame 190. The wire 200 is produced in a material with shape memory. Here, it is a material with shape memory exhibiting a rate of elongation at least greater than 1% in response to a temperature variation of 10° or of 20°. The composition of the material with shape memory is chosen such that the wire switches from its deployed state to its retracted state around a transition temperature $T_f$ lying between $T_{min}$ and $T_{max}$ and, preferably, equal to $(T_{min}+T_{max})/2$ to within plus or minus 15 or 25%, in which $T_{min}$ and $T_{max}$ are the respectively minimum and maximum temperatures between which the temperature of the source 182 varies. The assembly of the plate 196 with the wire 200 is produced in such a way that, at the temperature $T_f$, almost no stress is exerted on the plate 196. Thus, the converter 186 generates an excess of charges on the terminal 188 in its active position and an inverse excess of charges on the terminal 189 in the rest position.

A spring 206 is also housed between the beam 194 and the frame 190 to stress this beam to its rest position. Such a converter is described in more detail in the following article A2:

D. Zakharov, G. Lebedev, O. Cugat, J. Delamare, B. Viala, T. Lafont, L. Gimeno and A. Shelyakov, "*Thermal energy conversion by coupled shape memory and piezoelectric effects*", PowerMEMS'11, Seoul, Korea, JMM 2012.

The control device 184 comprises a variable magnetic field source which generates a magnetic field parallel to the direction X when the beam 194 is in its active position and parallel to the direction Y when the beam 194 is in its rest position. To do this without consuming the charges produced by the converter 186, the magnetic field source of the device 184 comprises a second converter suitable for generating the variable magnetic field directly from the energy to be harvested. This second converter comprises:

- a thermomechanical transducer suitable for transforming the temperature variation of the source 182 into a deformation of this transducer, and
- a permanent magnet 210 fixed, via a mechanical link, to this transducer to be displaced at the same time as the latter is deformed.

In this particular embodiment, the thermomechanical transducer is the wire 200. Thus, the same thermomechanical transducer is used both in the converter 186 and in the control device 184.

By way of illustration, here, the magnet 210 is directly fixed to the pulley 202 to be driven in rotation by this pulley between a position in which its magnetic moment is parallel to the direction X and an opposite position in which the direction of its magnetic moment is parallel to the direction Y. For example, the diameter of the pulley 202 is chosen such that it makes a quarter turn when the beam is displaced from its rest position to its active position. The magnet 210 can also be mechanically connected to the pulley 202 by a mechanical link which amplifies the angular displacement of this pulley.

The operation of the collection circuit 30 is the same as previously. Thus, only the details specific to the operation of the generator 180 are now given. When the temperature increases, the wire 200 is retracted. The beam 194 is then bent to its active position. In response, the plate 196 produces an excess of electrical charges on the terminal 188. When the beam 194 reaches its active position, the direction of the magnetic moment of the magnet 210 is aligned on the direction X. Thus, the charges produced by the converter 186 are transferred to the capacitor 3 only when the excess of charges produced on the terminal 188 is close to its maximum.

When the temperature decreases, the wire 200 slackens and, simultaneously, the magnet 210 turns in the reverse direction. At the same time, the converter 186 generates an excess of electrical charges on the terminal 189. When the direction of the magnetic moment of the magnet 210 reaches the direction Y, the excess of electrical charges produced on this terminal 189 is automatically transferred to the capacitor 3.

Many other embodiments are possible. For example, the capacitor 3 can be replaced by a battery. The capacitor 3 can also be replaced by an electrical element that does not have the capacity to store electrical energy. For example, the capacitor 3 is replaced by a load consuming the electrical energy received. It can be a resistive load. In the latter case, the inductances 58 and 132 can be omitted.

[Variants of the Source of Energy to be Harvested]

The source of energy to be harvested can also be a mechanical displacement of a part such as a pushbutton. In this case, the first converter can comprise only the electromechanical transducer directly linked to this part so that the displacement of this part causes the mechanical stress that it exerts on this electromechanical transducer to vary. In this case, the transducer of the control device is, for example, produced by mechanically linking a permanent magnet to the part which is displaced in such a way that this displacement of the part also drives the displacement of this permanent magnet and therefore generates the variable magnetic field which controls the switching of the magnetic switches. The other control devices described previously can also be implemented.

The variable magnetic field generated by the source is not necessarily a magnetic field generated by a permanent magnet mounted to rotate on an axis. For example, what has been previously described applies also to the case where only the amplitude of one of the components $B_X$ or $B_Y$ varies over time. For example, this can be the case if the permanent magnet is mounted on a part which is displaced only in translation parallel to the direction X. The source of energy to be harvested which generates the variable magnetic field can also be a coil powered from time to time by a current or a simple electrical conductor which is passed through by a current, the intensity of which varies over time.

[Variants of the Converter]

Other possible embodiments of the converter 20 are described in the article A1 previously referred to or in the application US2004/0126620A1.

The electromechanical transducer of the converter 20 does not necessarily comprise a piezoelectric material. For example, as a variant, the electromechanical transducer is produced from a capacitor, the capacitance of which varies as a function of a mechanical displacement. Typically, the capacitor comprises two moving electrodes separated from one another by a dielectric material. When the electrodes are displaced, the capacitance of the capacitor varies. The displacement of the electrodes is actuated by:

- a magnetostrictive material, to convert a magnetic field variation into a variation of electrical charges, or
- a thermomechanical transducer, to convert a temperature variation into a variation of electrical charges, or
- a mechanical displacement of a button to convert a mechanical displacement into a variation of electrical charges.

In a particular embodiment, the electrodes of the capacitor are produced in a magnetostrictive material. In this case, a variation of the amplitude of the magnetic field in a given direction results in a variation of the surface area of the electrodes and therefore of the capacitance of this capacitor.

In another variation, standard electrodes and a dielectric whose permittivity varies as a function of the magnetic field are chosen for the capacitor. The dielectric can, for example, be $BiFeO_3$. In this case also, a magnetic field variation results in a variation of the capacitance of the capacitor.

The variation of the capacitance of the capacitor is then transformed into a generation of electrical charges by an electronic device such as, for example, a device implementing the electrets. The generation of electricity from a variation of capacitance and using electrets is, for example, described in the following article:

S. Boisseau, G. Despesse and A. Sylvestre, "*Optimization of an electret-based energy harvester*", Smart Material and Structures, 2010, 19 075015, IOP Publishing Ltd.

The magnetostrictive material of the converter 20 can also be a material with negative magnetostriction coefficient. It can also be a material with an isotropic or anisotropic magnetostriction coefficient.

The converter 20 can comprise a number of assemblies of transducers connected in parallel between the connection terminals of this converter. For example, the converter 20 can comprise a second assembly identical to that described with reference to FIG. 3 but with a longitudinal direction that is angularly offset in the horizontal plane relative to the longitudinal direction of the first assembly. If the longitudinal directions of these assemblies are offset by 90°, the collection circuit and the control device operate as described previously. If the longitudinal directions are offset by an angle α other than 90°, the direction of actuation of the switches 52, 54 must be offset, in the plane XY relative to the direction of actuation of the switches 48, 56 by the same angle α. It will therefore be understood from this example that the angle α between the directions of actuation of the magnetic switches is chosen as a function of the phase shift between the variations of the excess of electrical charges produced by the converter.

Other embodiments of the converter 186 are possible. For example, other embodiments are described in the article A2 referred to previously. Other embodiments can also be found in the applications US 2011/0083714 or U.S. Pat. No. 7,397,169. The converter 186 can also use a bimetallic strip such as a copper-aluminium bimetallic strip as thermomechanical transducer.

[Variants of the Collection Circuits and of the Control Devices]

The preceding collection circuits and control devices have been described in the particular case where the electrical charges are collected on the connection terminal 22 only when the direction of the magnetic moment of the magnet 8 is parallel to the direction of actuation of the switch 48. As a variant, the collection circuits and the control devices are adapted to collect the charges on the terminal 22 for a number of different directions of the magnetic moment of the magnet 8, preferably uniformly distributed over an angular segment of 180°. For this, additional magnet switches are connected in parallel, respectively, to the switches 48 and 56. These additional magnetic switches are identical, respectively, to the switches 48 and 56 except that their direction of actuation is offset angularly by an angle β relative to the direction of actuation of the switches 48, 56. For example, if magnetic switches that have a direction of actuation offset by 45° relative to the direction X are connected in parallel to the switches 48 and 56, the charges accumulated on the terminal 22 are discharged to the capacitor 3:

when the field created by the magnet 8 in the switches forms an angle of 45° with the direction X, and
when the field created by the magnet 8 in the switches is parallel to the direction X.

Another solution for obtaining a function similar to that described above, without modifying the collection circuit, consists in replacing the magnet 8 with a multiple-pole magnet exhibiting magnetic moments in a number of different directions. In this case, the switch 48 is closed for a number of angles of rotation of the multiple-pole magnet lying between 0° and 180°. The same operation can also be obtained with a single-pole magnet which makes a number of complete revolutions on itself while the transducer of the control device is always deformed in the same direction. For example, the diameter of the pulley 202 is chosen such that the magnet 210 makes one or more complete revolutions on itself upon a single displacement of the beam 194 from its active position to its rest position. The switches 130 and 134 are not necessarily inside the coil 132. As a variant, they are placed in the field of this coil 132 but outside the turns forming this coil.

In the collection circuit 170, the diode 50 can be omitted.

The device 184 has been described in the particular case where it is the thermomechanical transducer which displaces the permanent magnet. As a variant, the thermomechanical transducer displaces the switches of the circuit 30 and not the permanent magnet.

The different embodiments of the collection circuit described in the case of the converter 20 can also be associated with the converter 186 or any other converter, of an energy to be harvested, as a variation of electrical charges stored between the connection terminals.

The device 184 has been described in the particular case where it uses the same magnetic or thermomechanical transducer as that used by the converter. As a variant, the control device comprises its own magnetic or thermomechanical transducer that is mechanically independent of that used by the converter of the energy to be harvested. In this case, the control device need not have any electromechanical transducer suitable for generating electrical charges. For example, this transducer comprises only a material with shape memory or a magnetostrictive material.

The material with shape memory used in the embodiment of FIG. 17 to produce the converter and the control device can be replaced with a material with strong coefficient of expansion to form a bimetallic strip with the layer of piezoelectric material. In another variant, the material with shape memory is replaced by a magnetostrictive material to generate electrical charges and control the switches of the collection circuit from a magnetic field variation.

[Variants of Switches]

Numerous embodiments are possible for the magnetic switches. For example, the magnetic switches can also be produced as described in the application FR 2 912 128. In another embodiment, only one of the blades 84 or 86 is mobile. Preferably, these switches are produced in one and the same substrate.

A magnetic shielding, notably around the switches 130 and 134, can be provided. Similarly, a magnetic shielding can be provided around all of the switches to insulate them from the magnetic fields other than those generated by the source of energy to be harvested.

It is also possible to provide a magnetic flux guide to guide and concentrate the magnetic flux from the magnetic field source to the magnetic switches. For example, the magnetic flux guide is a magnetic core.

The switches 130, 134, 172 or the diode 60 can be replaced by electronic switches such as transistors or thyristors.

Whatever the mechanical switch concerned, the electrical contacts of this switch are not necessarily realized by a projecting electric bump contact. For example, the electrical contact can also be a region of the element which is deformed or is displaced and which comes to bear mechanically on the other electrical contact to establish the electrical continuity.

The collection circuits described here can be produced with any type of controllable switches and not only magnetic switches. If the switches are not magnetic switches, the control of these switches can be produced in a conventional manner to operate as described above.

What is claimed is:

1. An apparatus comprising a generator for generating electricity, said generator comprising a first converter, a collection circuit, and a control device, wherein the first converter comprises first and second connection terminals, wherein the first converter converts a variation of energy to be harvested into a corresponding excess of electrical charge on the first connection terminal relative to the second connection terminal, wherein the collection circuit collects the excess of electrical charge on the first connection terminal, wherein the collection circuit comprises an output terminal and a first switch that is connected to the first connection terminal, wherein the collected charge is delivered to the output terminal of the collection circuit, wherein the first switch comprises a mechanical switch that is controllable to switch between being opened and being closed, wherein, when the mechanical switch is closed, first and second electrical contacts bear directly on each other to establish electrical continuity, thus allowing the mechanical switch to discharge electrical charge through the first connection terminal, wherein, when the mechanical switch is opened, an interposed electrically-insulating medium mechanically separates the first and second electrical contacts, thus preventing discharge of the electrical charge through the first terminal, wherein the control device switches the first switch to the closed position when the excess of electrical charge present on the first connection terminal exceeds a first predetermined threshold, wherein the mechanical switch comprises a magnetic switch that comprises a blade made of a magnetic material that is suitable for displacing the first and second electrical contacts from an open position thereof to a closed position thereof when the magnetic field in the first switch is in an actuation configuration, wherein the first switch is incapable of keeping the electrical contacts in the closed position when the magnetic field in the first switch is in a configuration other than the actuation configuration, wherein the control device comprises a magnetic field source that exposes the switch to a variable magnetic field, wherein the first switch is positioned relative to the magnetic field source such that the variable magnetic field in the first switch reaches an actuation configuration only when the excess of electrical charge present on the first connection terminal exceeds the first predetermined threshold, wherein the first converter is configured for converting a variation of a magnetic field into a corresponding excess of electrical charge on the first connection terminal relative to the second terminal, and wherein the first converter is placed in the field lines of the magnetic field source to convert magnetic field variations into a corresponding excess of electrical charge on the first connection terminal such that the source of energy to be harvested is the magnetic field source.

2. The apparatus of claim 1, wherein the magnetic field source is configured to generate a variable magnetic field that has a magnetic moment that varies over time between a first position and a second position, wherein the first converter is configured for converting the variable magnetic field into an excess of electrical charge on the first connection terminal and into an excess of electrical charge on the second connection terminal, wherein the excess on the first connection terminal exceeds the first predetermined threshold for the first position of the magnetic moment, wherein the excess of electrical charge on the second connection terminal exceeds a second predetermined threshold for the second position of the magnetic moment, wherein the collection circuit comprises a second controllable magnetic switch connected to the second connection terminal, wherein the second switch is configured for switching between an open position and a closed position, wherein when in the open position, the second switch prevents discharge through the second connection terminal and wherein, when in the closed position the second switch allows discharge through the second connection terminal, wherein the second switch is positioned relative to the source in such a way that the variable magnetic field that the source generates in the second switch reaches an actuation configuration of the second switch only at the moment when the excess of electrical charge present on the second connection terminal exceeds the second predetermined threshold, and wherein the actuation configurations of the first and second switches are distinct.

3. The apparatus of claim 2, wherein the first switch is connected in series between the first connection terminal and the output terminal to insulate and, alternately, to electrically connect the first connection terminal to the output terminal and wherein the second switch is connected in series between the second connection terminal and the output terminal to insulate and, alternately, to electrically connect the second connection terminal to the output terminal.

4. The apparatus of claim 2, wherein the first converter comprises a capacitor that is selected such that, when any one of the connection terminals is electrically insulated from any electrical circuit, the capacitor retains at least 50% of the excess of electrical charge brought previously to the terminal for at least 1 millisecond, wherein the collection circuit comprises a controllable releasing switch, a first branch and a second branch wherein the first and second branches connect in parallel to one another between the first and second connection terminals, wherein the first branch comprises the first switch and the second branch comprises the second switch, wherein the controllable releasing switch connects in series between one of the connection terminals and the output terminal, wherein the controllable releasing switch switches between a non-conducting state and a conducting state, wherein, in the non-conducting state, the controllable releasing switch electrically insulates the one of the connection terminals from the output terminal, wherein, in the conducting state, the controllable releasing switch electrically connects the one of the connection terminals to the output terminal, wherein the control device is configured to switch the releasing switch to the conducting state only when the excess of electrical charge present on the connection terminal exceeds a third predetermined threshold, and wherein the third predetermined threshold exceeds the first and second predetermined thresholds.

5. The apparatus of claim 4, wherein the collection circuit comprises a coil connected in series with the first switch, wherein, when the first switch closes, excess electrical charge produced by the first converter passes through the coil, thereby causing the coil to generate a magnetic field, and the releasing switch comprises a magnetic switch positioned relative to the coil in such a way that the magnetic field generated by this coil corresponds, in the releasing switch, to an actuation configuration of the releasing switch only when the excess of electrical charge exceeds the third predetermined threshold.

6. The apparatus of claim 1, wherein the first converter comprises an electromechanical transducer and a magnetic transducer, wherein the electromechanical transducer directly transforms a mechanical stress exerted thereon into an excess of electrical charge collected by the collection circuit, wherein the magnetic transducer is fixed with no degree of freedom to the electromechanical transducer, wherein the magnetic transducer comprises a magnetostrictive material that converts a variation of the variable magnetic field into a mechanical stress exerted on the electromechanical transducer.

7. The apparatus of claim 6, wherein the electromechanical transducer comprises piezoelectric material.

8. The apparatus of claim 7, wherein the piezoelectric layer's coefficient of coupling of the coupling is greater than 10%.

9. The apparatus of claim 1, wherein the converter comprises a magnetostrictive layer between first and second piezoelectric layers.

10. The apparatus of claim 9, wherein the magnetostrictive layer has a magnetostrictive coefficient that is greater than 100 ppm.

11. The apparatus of claim 9, wherein the magnetostrictive layer has a magnetostrictive coefficient that is greater than 1000 ppm.

12. The apparatus of claim 9, wherein the magnetostrictive layer comprises made of FeSiB.

13. The apparatus of claim 9, wherein the magnetostrictive layer comprises an alloy having a formula of the form $Tb_xDy_{1-x}Fe_2$.

14. An apparatus comprising a generator for generating electricity, said generator comprising a first converter, a collection circuit, and a control device, wherein the first converter comprises first and second connection terminals, wherein the first converter converts a variation of energy to be harvested into a corresponding excess of electrical charge on the first connection terminal relative to the second connection terminal, wherein the collection circuit collects the excess of electrical charge on the first connection terminal, wherein the collection circuit comprises an output terminal and a first switch that is connected to the first connection terminal, wherein the collected charge is delivered to the output terminal of the collection circuit, wherein the first switch comprises a mechanical switch that is controllable to switch between being opened and being closed, wherein, when the mechanical switch is closed, first and second electrical contacts bear directly on each other to establish electrical continuity, thereby allowing the mechanical switch to discharge electrical charge through the first connection terminal, wherein, when the mechanical switch is opened, an interposed electrically-insulating medium mechanically separates the first and second electrical contacts, thereby preventing discharge of the electrical charge through the first terminal, wherein the control device switches the first switch to the closed position when the excess of electrical charge present on the first connection terminal exceeds a first predetermined threshold, wherein the mechanical switch comprises a magnetic switch that comprises a blade made of a magnetic material that is suitable for displacing the first and second electrical contacts from an open position thereof to a closed position thereof when the magnetic field in the first switch is in an actuation configuration, wherein the first switch is incapable of keeping the electrical contacts in the closed position when the magnetic field in the first switch is in a configuration other than the actuation configuration, wherein the control device comprises a magnetic field source that exposes the switch to a variable magnetic field, wherein the first switch is positioned relative to the magnetic field source such that the variable magnetic field in the first switch reaches an actuation configuration only when the excess of electrical charge present on the first connection terminal exceeds the first predetermined threshold, wherein the magnetic field source comprises a second additional converter, wherein the additional converter comprises a permanent magnet, a transducer, and a mechanical link, wherein the transducer is configured for transforming the variation of the energy to be harvested into a mechanical deformation of this transducer, and wherein the mechanical link is a link between the permanent magnet and the transducer, wherein the link is configured for varying the position of the permanent magnet relative to the first magnetic switch between a first position and a second position, wherein, in the first position, the magnetic field generated by the permanent magnet corresponds, in the first switch, to an actuation configuration of the first switch, and wherein, in the second position, the magnetic field generated by the permanent magnet does not correspond, in the first switch, to an actuation configuration of the first switch.

15. The apparatus of claim 14, wherein the first converter is configured for converting the energy to be harvested into an excess of electrical charge on the first connection terminal exceeding the first predetermined threshold when the permanent magnet is in the first position and into an excess of electrical charge on the second connection terminal exceeding a second predetermined threshold when the permanent magnet is in the second position, wherein the collection circuit comprises a second controllable magnetic switch connected to the second connection terminal, wherein the second switch is configured for switching between an open position and a closed position, wherein, when in the opened position, the second switch prevents discharge of electrical charge through the second connection terminal, wherein, when in the closed position, the second switch allows discharge of electrical charge through the second connection terminal, wherein the second switch is positioned relative to the permanent magnet such that in the first position, the magnetic field generated by the permanent magnet does not correspond, in the second switch, to an actuation configuration of the second switch, wherein the second switch is positioned relative to the permanent magnet such that, in the second position, the magnetic field generated by the permanent magnet corresponds, in the second switch, to an actuation configuration of the second switch, and wherein the actuation configurations of the first and second switches are distinct.

16. The apparatus of claim 14, wherein the first converter comprises a first transducer and a second transducer, wherein the first transducer comprises an electromechanical transducer configured for transforming a mechanical stress exerted thereon into the excess of electrical charge collected by the collection circuit wherein the second transducer is fixed with no degree of freedom to the first electromechanical transducer, and wherein the second transducer is configured for converting a variation of the energy to be harvested into a mechanical stress exerted on the electromechanical transducer.

17. The apparatus of claim 16, wherein the second transducer comprises a thermomechanical transducer that is configured to mechanically deform in response to a temperature variation.

18. The apparatus of claim 17, wherein the thermomechanical transducer comprises a material with shape memory.

19. The apparatus of claim 14, wherein the same transducer forms both the second transducer of the first converter and the transducer of the control device.

* * * * *